United States Patent
Chen et al.

(10) Patent No.: US 10,182,654 B2
(45) Date of Patent: Jan. 22, 2019

(54) MOUNTING PART FOR SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Hsiu-Chiang Liang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 3 days.

(21) Appl. No.: 15/255,525

(22) Filed: Sep. 2, 2016

(65) Prior Publication Data

US 2017/0095080 A1    Apr. 6, 2017

(30) Foreign Application Priority Data

Oct. 6, 2015   (TW) .............................. 104132953 A

(51) Int. Cl.
| | |
|---|---|
| H05K 7/18 | (2006.01) |
| A47B 88/423 | (2017.01) |
| H05K 7/14 | (2006.01) |
| A47B 88/427 | (2017.01) |

(52) U.S. Cl.
CPC .......... *A47B 88/423* (2017.01); *A47B 88/427* (2017.01); *H05K 7/1489* (2013.01); *H05K 7/183* (2013.01); *A47B 2088/4278* (2017.01)

(58) Field of Classification Search
CPC ........ H05K 7/183; H05K 7/1489; A47F 7/00; A47B 88/042; A47B 88/0418; A47B 88/0422; A47B 88/047; A47B 88/00; A47B 2088/0429
USPC ... 248/298.1, 316.8, 220.21, 220.31, 220.41, 248/265.2, 265.3, 201; 312/334.7, 333, 312/334.8, 334.44, 334.46, 330.1, 223.1, 312/265.1, 265.4, 319.1, 334.1, 334.4, 312/334.5
See application file for complete search history.

(56) References Cited

U.S. PATENT DOCUMENTS

| | | | |
|---|---|---|---|
| 6,220,456 B1 * | 4/2001 | Jensen ...................... | G06F 1/16 211/189 |
| 7,108,340 B2 * | 9/2006 | Lai .......................... | A47B 88/57 312/333 |
| 7,192,103 B2 * | 3/2007 | Hamilton ................ | A47B 88/43 211/175 |
| 7,216,646 B2 | 5/2007 | Le et al. | |

(Continued)

*Primary Examiner* — Nkeisha Smith
(74) *Attorney, Agent, or Firm* — Rosenberg, Klein & Lee

(57) ABSTRACT

A mounting part is adapted to mount an object to a rail of a slide rail assembly. The rail is arranged with an engaging member. The engaging member has an elastic portion and an engaging portion. The mounting part includes a mounting feature. In the course in which the mounting part is mounted to the rail, the mounting part pushes and thereby displaces the engaging portion of the engaging member, and the elastic portion stores an elastic force in response to displacement of the engaging portion. Once the mounting feature of the mounting part corresponds in position to the engaging portion, the elastic portion of the engaging member releases the elastic force and thus drives the engaging portion into engagement with the mounting feature.

10 Claims, 10 Drawing Sheets

(56) References Cited

U.S. PATENT DOCUMENTS

| | | | | |
|---|---|---|---|---|
| 7,703,734 B2* | 4/2010 | Chen | A47B 88/43 | 108/108 |
| 7,744,178 B2* | 6/2010 | Bridges | G11B 33/12 | 312/334.47 |
| 7,871,139 B2* | 1/2011 | Yu | A47B 88/43 | 312/333 |
| 7,911,777 B2* | 3/2011 | Fan | G06F 1/187 | 312/223.1 |
| 8,056,994 B2* | 11/2011 | Chen | A47B 88/427 | 312/334.14 |
| 8,231,188 B1* | 7/2012 | Chen | A47B 88/57 | 312/333 |
| 8,317,037 B2* | 11/2012 | Henderson | H05K 7/1489 | 211/26 |
| 8,320,118 B2* | 11/2012 | Chuang | G11B 33/124 | 211/26 |
| 8,807,672 B2* | 8/2014 | Gasser | A47B 88/16 | 312/333 |
| 8,939,525 B1* | 1/2015 | Chen | A47B 88/047 | 312/333 |
| 9,161,625 B2* | 10/2015 | Chen | A47B 88/044 | |
| 9,557,782 B2* | 1/2017 | Hsu | G06F 1/182 | |
| 9,693,627 B2* | 7/2017 | Chen | A47B 88/407 | |
| 9,750,155 B2* | 8/2017 | Henderson | G06F 1/181 | |
| 2005/0231083 A1* | 10/2005 | Garcie, Jr. | A47B 88/467 | 312/333 |
| 2007/0018547 A1* | 1/2007 | Yang | H05K 7/1489 | 312/333 |
| 2007/0114895 A1* | 5/2007 | Chen | H05K 7/1489 | 312/333 |
| 2008/0303397 A1* | 12/2008 | Chen | A47B 88/427 | 312/334.46 |
| 2014/0145577 A1* | 5/2014 | Zimmermann | E05B 65/44 | 312/327 |
| 2015/0129526 A1* | 5/2015 | Chen | A47B 88/044 | 211/134 |
| 2015/0181753 A1* | 6/2015 | Murakami | H05K 7/1489 | 211/26 |
| 2016/0345730 A1* | 12/2016 | Lim | A47B 96/07 | |
| 2017/0013959 A1* | 1/2017 | Chen | A47B 96/07 | |
| 2017/0135472 A1* | 5/2017 | Chen | A47B 88/0014 | |

* cited by examiner

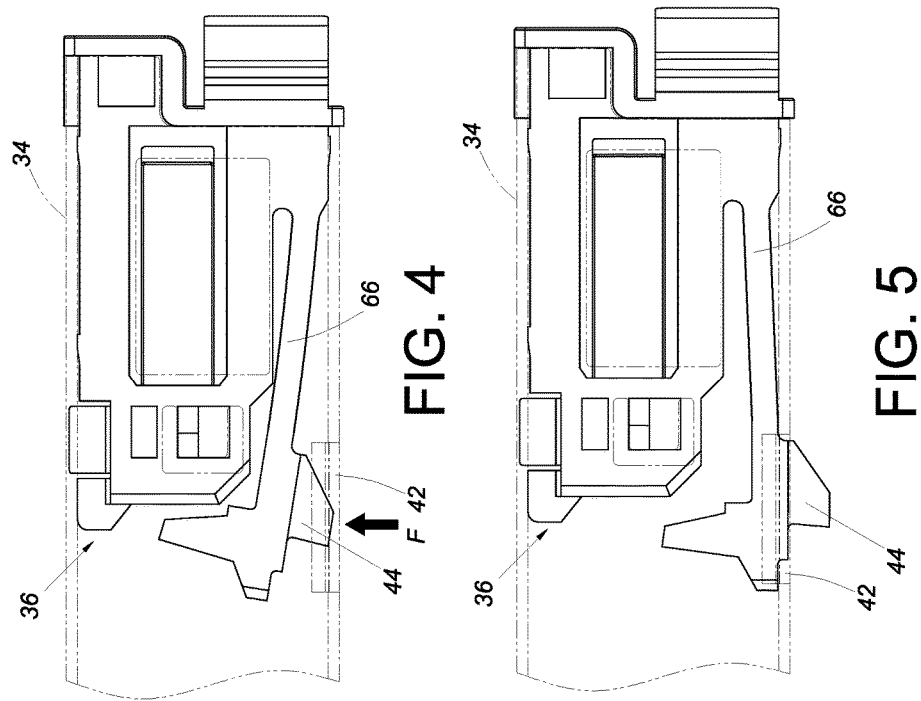

MOUNTING PART FOR SLIDE RAIL ASSEMBLY

FIELD OF THE INVENTION

The present invention relates to a mounting part and more particularly to a mounting part for use with a slide rail assembly.

BACKGROUND OF THE INVENTION

In a system where a slide rail assembly is used, a moving rail of the slide rail assembly is typically configured to carry an object so that the object can be displaced to an extended position and a retracted position with respect to another object, e.g., a cabinet, in the system. Generally, the object is connected to the moving rail of the slide rail assembly by at least one fastener, which however inconveniences not only the process of mounting the object to the slide rail assembly, but also maintenance of the system. In addition, as market demands vary, so does the form or appearance of the object to be carried. It is therefore an important issue in the related industries to find ways to mount an object to a slide rail assembly more conveniently.

SUMMARY OF THE INVENTION

The present invention relates to a mounting part for use with a slide rail assembly, the objective being to mount an object to a rail without using tools.

According to one aspect of the present invention, a mounting part for a slide rail assembly is configured to mount an object to the slide rail assembly. The slide rail assembly includes a first rail and a second rail. The second rail can be displaced with respect to the first rail and is arranged with an engaging member. The engaging member has an engaging portion and an elastic portion for applying an elastic force to the engaging portion. The mounting part includes a base portion and a first lateral portion substantially perpendicularly connected to the base portion. One of the base portion and the first lateral portion has a first mounting feature engaged with the engaging portion of the engaging member.

Preferably, the mounting part further includes a second lateral portion substantially perpendicularly connected to the base portion. The second lateral portion and the first lateral portion are located on two lateral sides of the base portion respectively and extend in different directions.

Preferably, the first mounting feature includes an opening and a stop wall adjacent to the opening. The engaging portion of the engaging member extends through the opening to engage with the stop wall.

Preferably, the second rail of the slide rail assembly has a fastening portion, and the mounting part further has a second mounting feature which includes a first wall and a second wall. The second mounting feature is mounted to the fastening portion such that the first wall and the second wall are adjacent to two lateral sides of the fastening portion respectively.

Preferably, the base portion of the mounting part is adjacent to the second rail, and the first lateral portion of the mounting part is adjacent to a lateral side of the second rail.

Preferably, the engaging member further has a flexible portion, and the mounting part has an abutting portion abutting against the flexible portion.

According to another aspect of the present invention, a mounting part for a slide rail assembly is adapted to mount an object to a rail of the slide rail assembly, wherein the rail is arranged with an engaging member having an elastic portion and an engaging portion. The mounting part includes a first mounting feature. In the course in which the mounting part is mounted to the rail, the mounting part pushes and thereby displaces the engaging portion of the engaging member, and the elastic portion stores an elastic force in response to displacement of the engaging portion. Once the first mounting feature of the mounting part corresponds in position to the engaging portion, the elastic portion of the engaging member releases the elastic force such that the engaging portion engages with the first mounting feature of the mounting part.

Preferably, the mounting part further includes a base portion, a first lateral portion, and a second lateral portion. The first lateral portion and the second lateral portion are located on two lateral sides of the base portion respectively and extend in different directions. The first lateral portion has the first mounting feature while the second lateral portion is configured to abut against the object.

Preferably, the rail of the slide rail assembly has a fastening portion, and the mounting part further has a second mounting feature which includes a first wall and a second wall. The second mounting feature is mounted to the fastening portion such that the first wall and the second wall are adjacent to two lateral sides of the fastening portion respectively.

Preferably, one of the mounting part and the engaging portion of the engaging member has a guiding section, and the mounting part pushes the engaging portion of the engaging member via the guiding section.

BRIEF DESCRIPTION OF THE DRAWINGS

FIG. 4 is a schematic drawing in which the engaging member in FIG. 2 is partially arranged in the rail, and in which the engaging portion is operated and thereby displaced;

FIG. 5 is similar to FIG. 4 except that the engaging portion has yet to be operated;

DETAILED DESCRIPTION OF THE INVENTION

Figure 1:
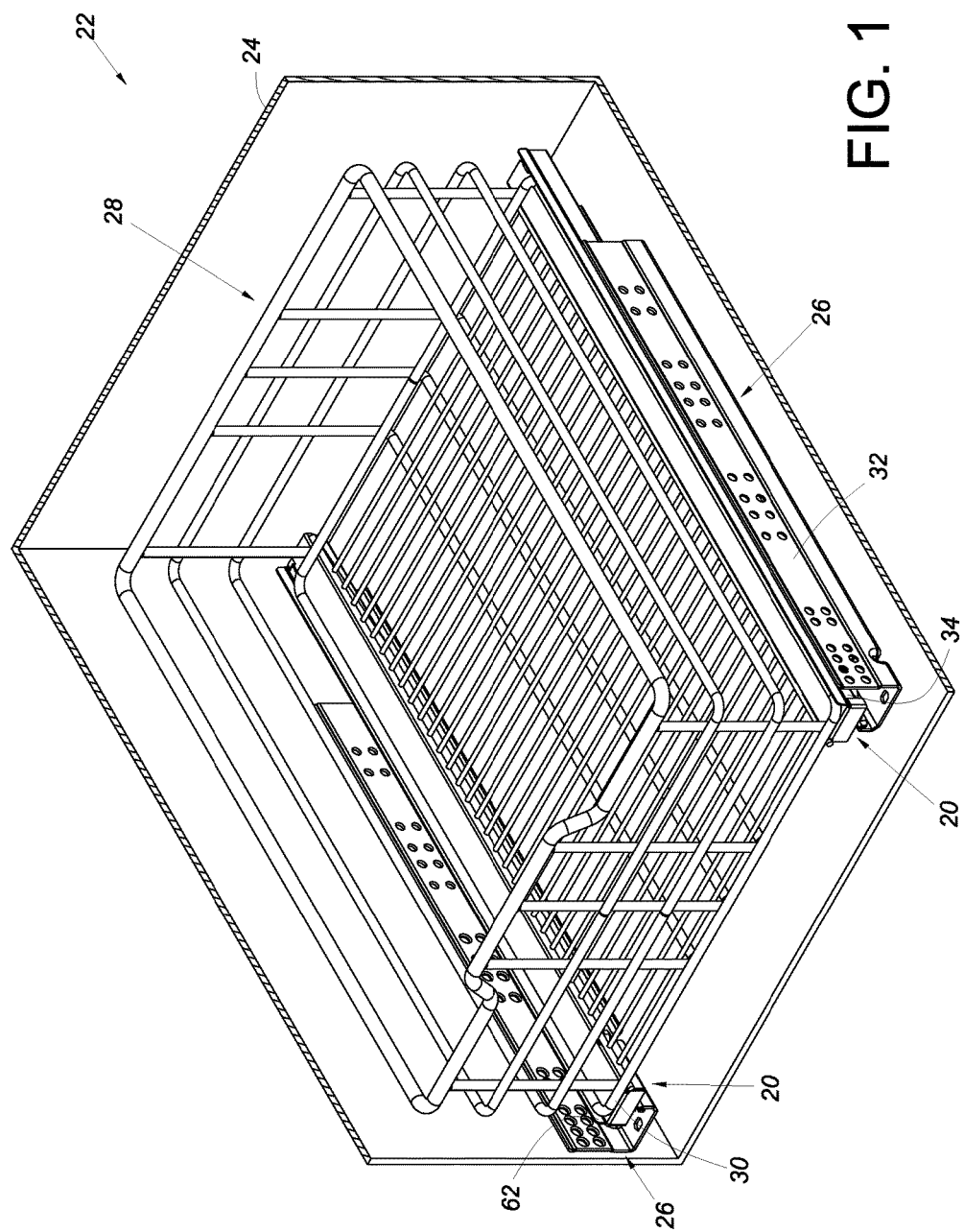
FIG. 1 is a perspective view of a piece of furniture to which an embodiment of the present invention is applied.

Referring to FIG. 1, the mounting part 20 for use with a slide rail assembly (hereinafter referred to as the mounting part 20 for short) in an embodiment of the present invention is applied to a piece of furniture 22. The furniture 22 includes a cabinet 24, two slide rail assemblies 26, and an object 28. The two slide rail assemblies 26 can be arranged on two lateral sides of the cabinet 24 respectively while the object 28 can be a basket. In this embodiment, the object 28 includes a plurality of vertically spaced, enclosing frames 30 and is mounted to the two slide rail assemblies 26 via two mounting parts 20 respectively. Each slide rail assembly 26 preferably includes a first rail 32 and a second rail 34 which can be displaced with respect to the first rail 32, and each mounting part 20 is mounted to the second rail 34 of the corresponding slide rail assembly 26 so that the object 28 can be displaced with respect to the cabinet 24 via the second rails 34 of the slide rail assemblies 26. The mounting parts 20 can be either directly formed on the object 28 or attached to the object 28. For example, the mounting parts 20 can be connected to the object 28 by soldering, threaded connection, mutual engagement, adhesive bonding, or a fastening means.

Figure 2:
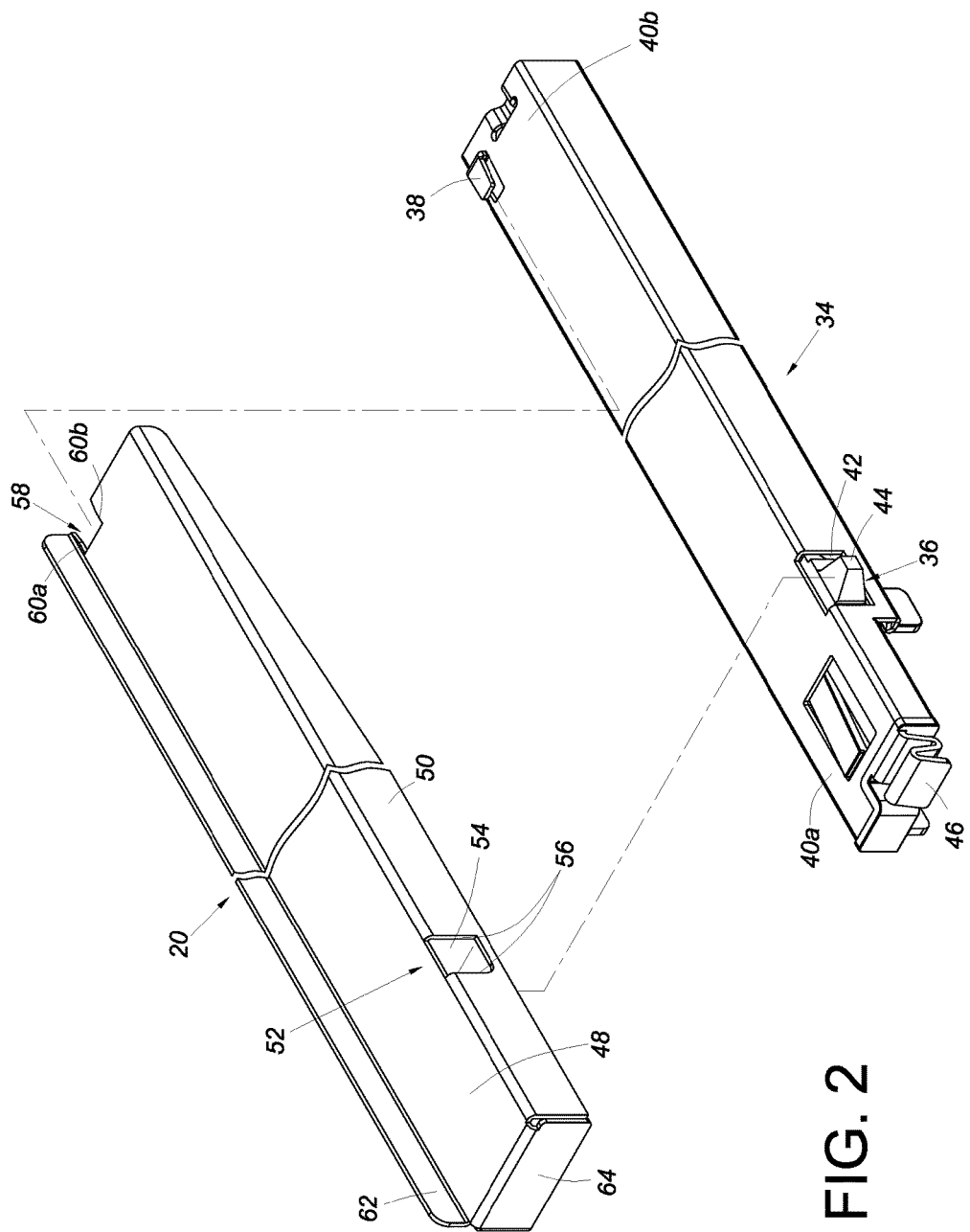
FIG. 2 is an exploded perspective view of a mounting part in the embodiment in FIG. 1 and a rail.

As shown in FIG. 2, the second rail 34 is arranged with an engaging member 36 and a fastening portion 38. More specifically, the second rail 34 has a front portion 40a, a rear portion 40b, and a first opening 42 adjacent to the front portion 40a. The engaging member 36 has an engaging portion 44 extending out of the second rail 34 through the first opening 42 of the second rail 34. Preferably, the engaging member 36 further has a flexible portion 46. The fastening portion 38 can be arranged adjacent to the rear portion 40b of the second rail 34.

Figure 3:
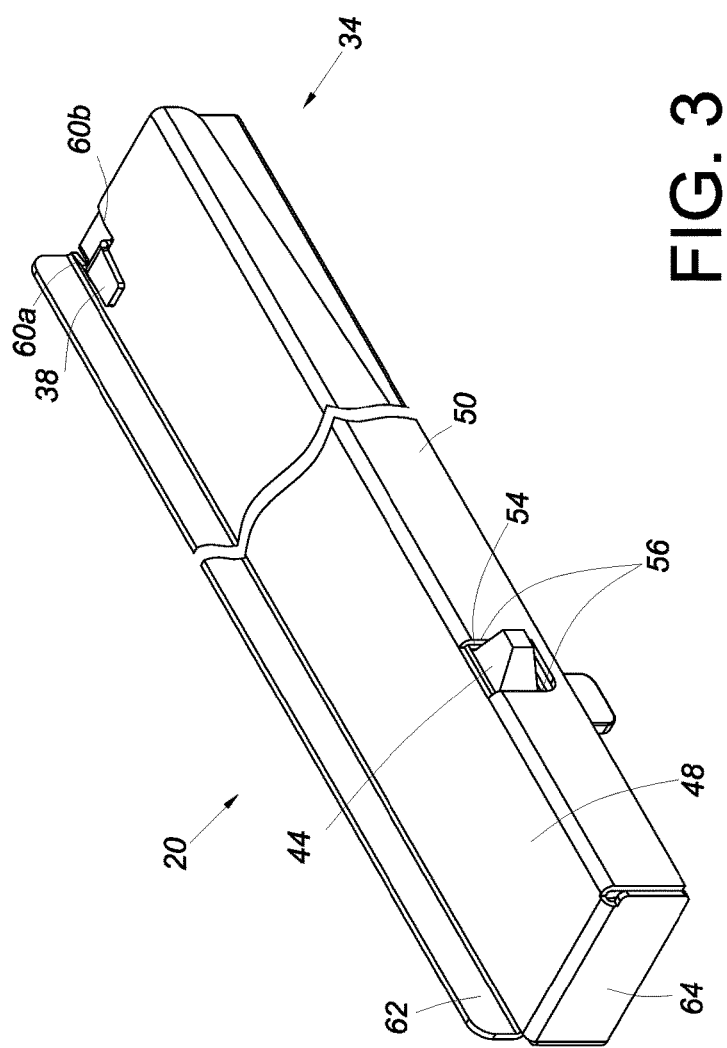
FIG. 3 is an assembled perspective view of the mounting part and the rail in FIG. 2.

Referring to FIG. 2 and FIG. 3, the mounting part 20 includes a base portion 48 and a first lateral portion 50 substantially perpendicularly connected to the base portion 48. One of the base portion 48 and the first lateral portion 50 has a first mounting feature 52 for engaging with the engaging portion 44 of the engaging member 36. Preferably, the first mounting feature 52 includes a second opening 54 and at least one stop wall 56 adjacent to the second opening 54. The second opening 54 allows passage of the engaging portion 44 of the engaging member 36 in order for the engaging portion 44 to engage with the at least one stop wall 56, e.g., to be engaged between two stop walls 56. Preferably, the mounting part 20 further has a second mounting feature 58, which includes a first wall 60a and a second wall 60b opposite the first wall 60a. When the second mounting feature 58 is fastened with the fastening portion 38 of the second rail 34, the first wall 60a and the second wall 60b are adjacent to two lateral sides of the fastening portion 38 respectively. Preferably, the mounting part 20 further includes a second lateral portion 62 and an abutting portion 64. The second lateral portion 62 is substantially perpendicularly connected to the base portion 48. The second lateral portion 62 and the first lateral portion 50 are located on two lateral sides of the base portion 48 respectively and extend in different directions with respect to the base portion 48. The second lateral portion 62 is configured to abut against or connect with at least one enclosing frame 30 of the object 28 (as can be seen in FIG. 1).

Referring to FIG. 4 and FIG. 5, a portion of the engaging member 36 lies inside the second rail 34. The engaging member 36 further has an elastic portion 66 for applying an elastic force to the engaging portion 44. That is to say, the elastic portion 66 allows the engaging portion 44 to be displaced by a user's operation. For instance, a user can apply a force F to the engaging portion 44 to displace the engaging portion 44 from outside the first opening 42 of the second rail 34 to inside the first opening 42. Once the force F is removed, the elastic force of the elastic portion 66 drives the engaging portion 44 from inside the first opening 42 to outside the first opening 42.

Figure 6:
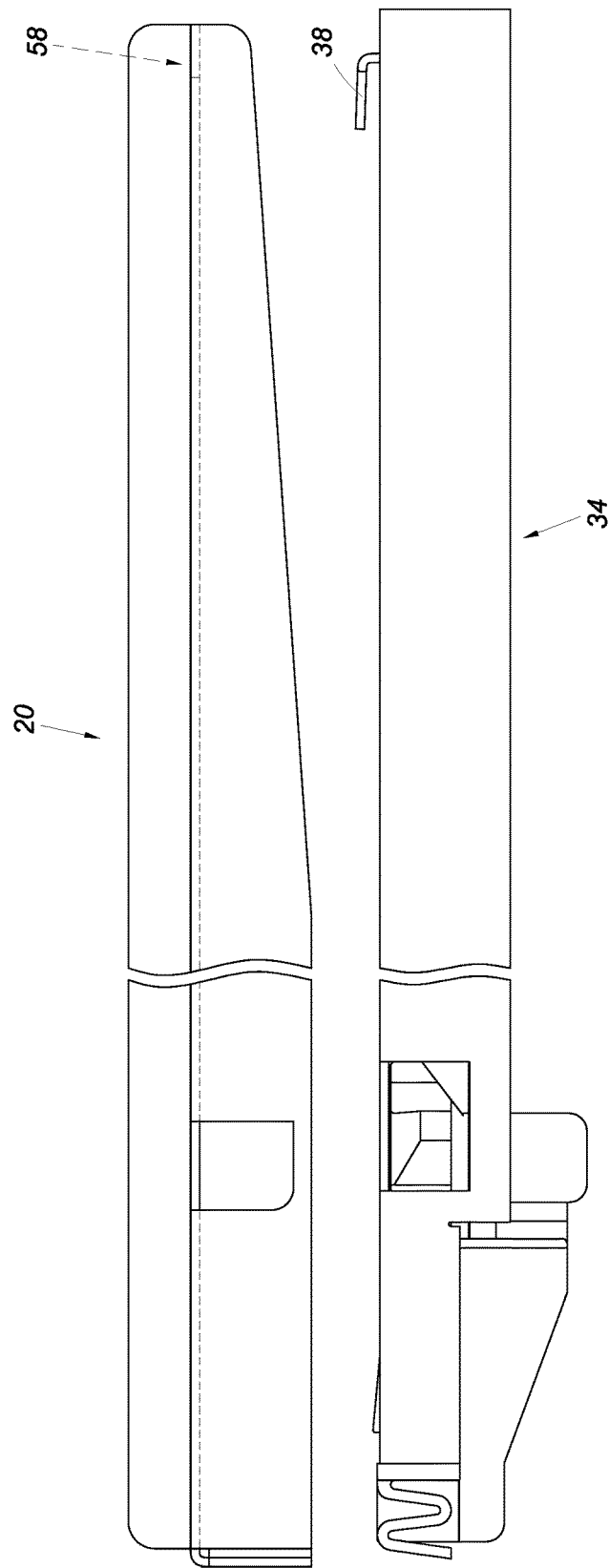
FIG. 6 schematically shows how the mounting part in FIG. 2 is mounted to the rail.
Figure 7:
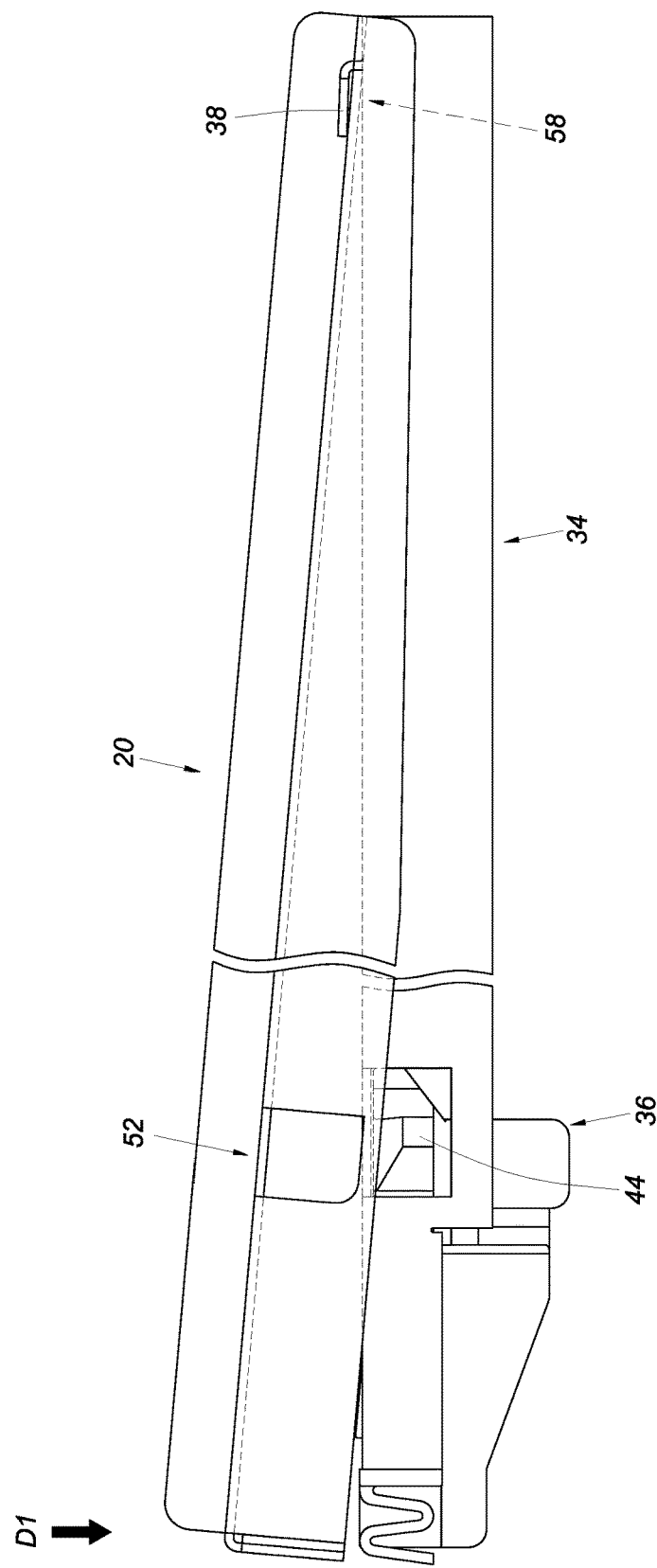
FIG. 7 schematically shows how the mounting part in FIG. 6 is further operated in order to be mounted on the rail.
Figure 8:
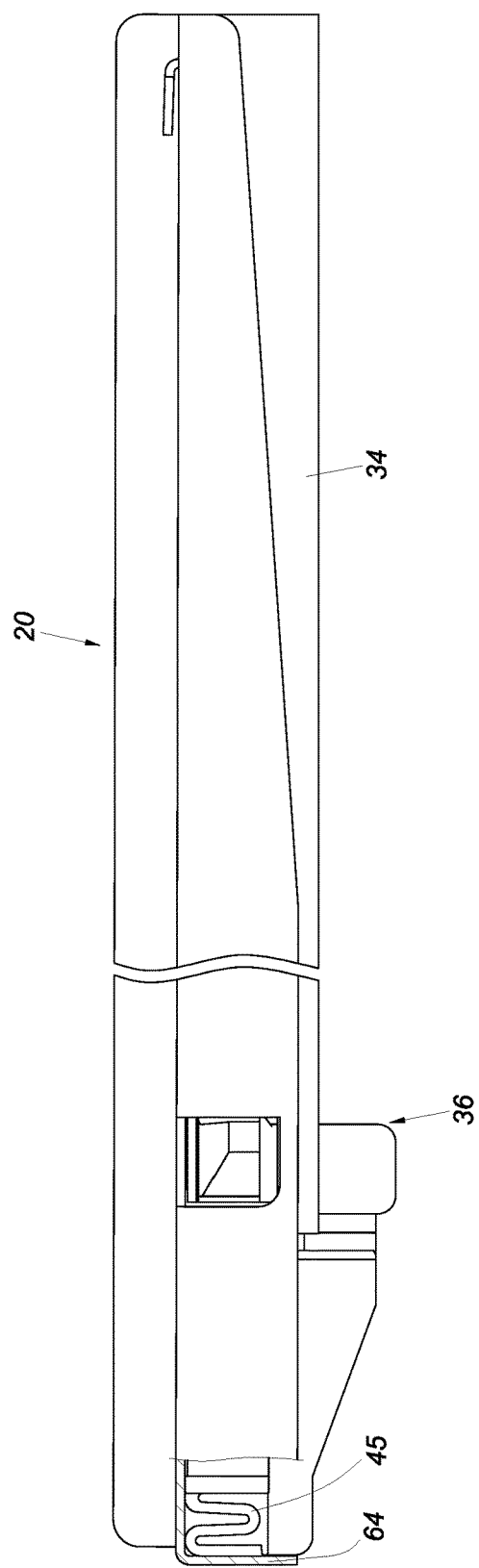
FIG. 8 schematically shows the mounting part and the rail in FIG. 7 after the mounting operation is completed, with the abutting portion of the mounting part abutting against the flexible portion of the engaging member.

When it is desired to mount the mounting part 20 to the second rail 34, referring to FIG. 6 and FIG. 7, the user begins by mounting the second mounting feature 58 of the mounting part 20 to the fastening portion 38 of the second rail 34. Then, a force is applied in a first direction D1 to mount the first mounting feature 52 of the mounting part 20 to the engaging portion 44 of the engaging member 36 of the second rail 34, such that the abutting portion 64 of the mounting part 20 abuts against the flexible portion 46 of the engaging member 36, as shown in FIG. 8. The flexible portion 46 thus produces a cushioning effect on the abutting portion 64 of the mounting part 20.

Figure 9:
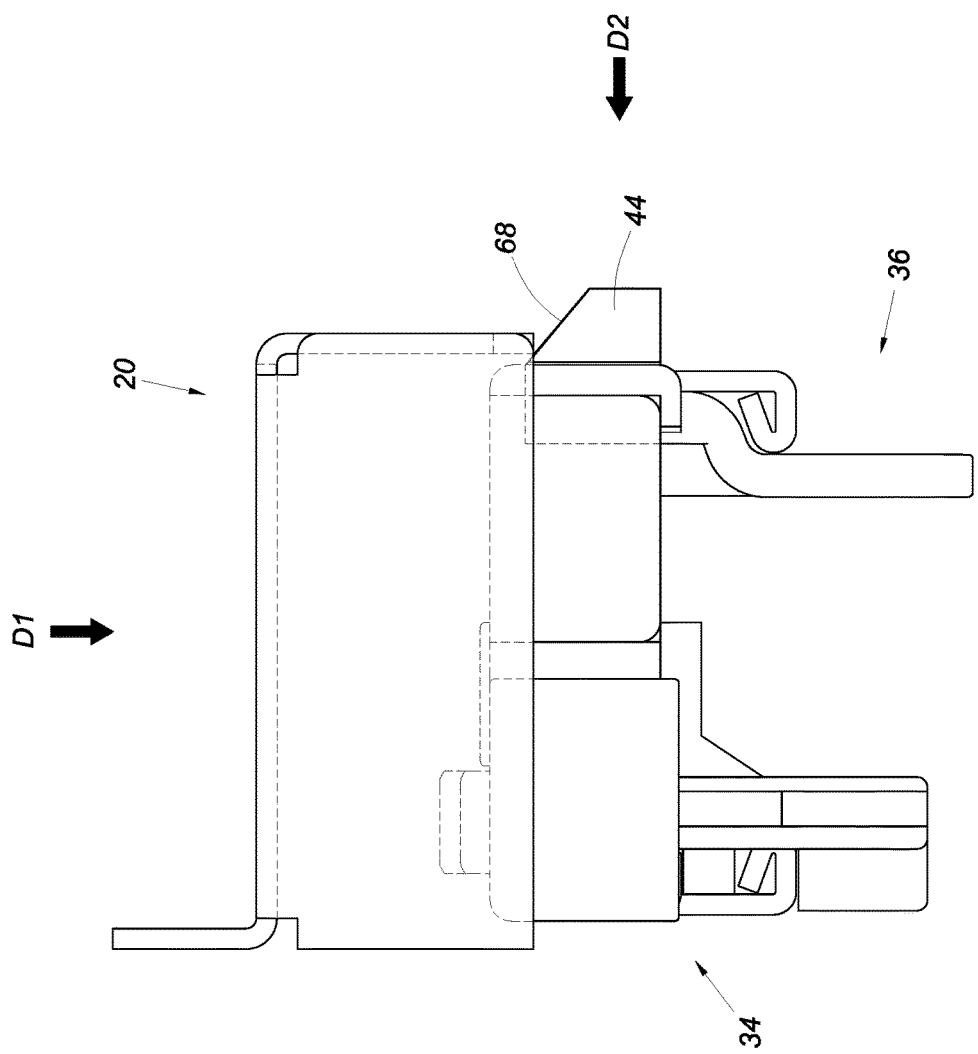
FIG. 9 is another schematic drawing showing how the mounting part in FIG. 2 is mounted to the rail.
Figure 10:
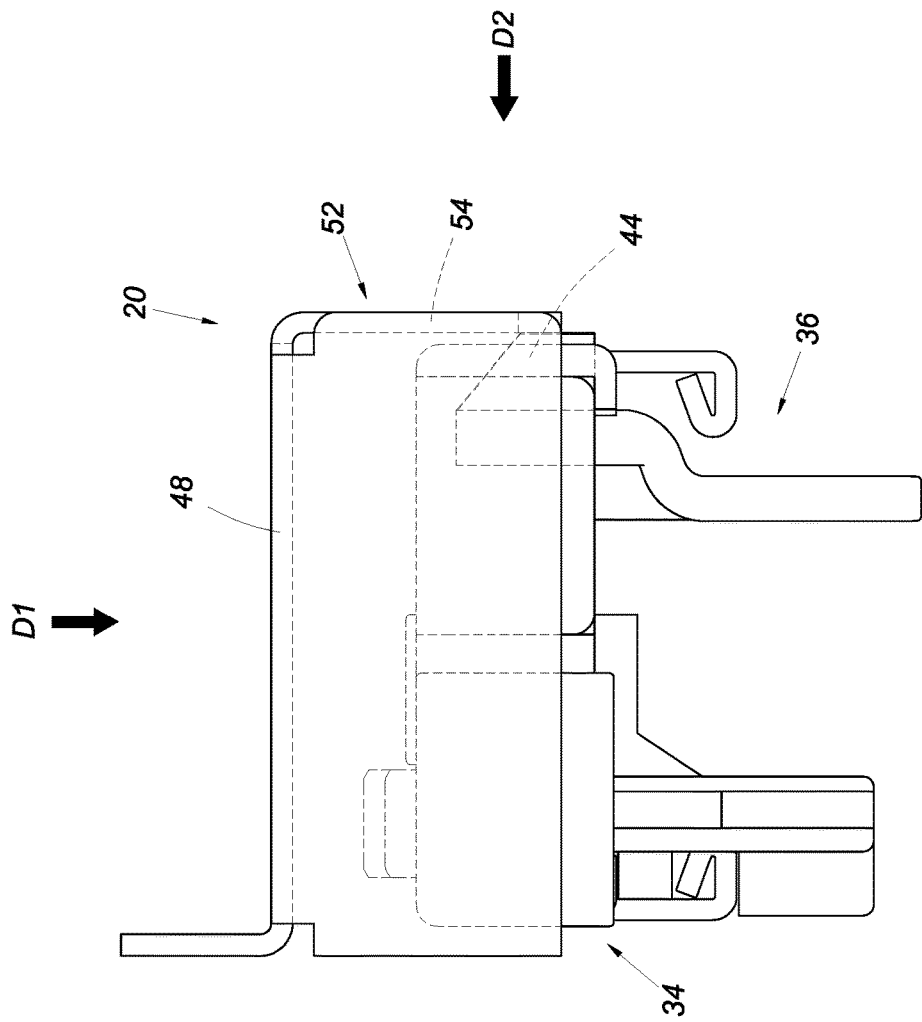
FIG. 10 schematically shows how the mounting part in FIG. 9 is further operated in order to be mounted on the rail, or more particularly how the engaging member is displaced by operating the mounting part.

In the course in which the force in the first direction D1 is applied to mount the mounting part 20 to the second rail 34, referring to FIG. 9 and FIG. 10, the mounting part 20 pushes the engaging portion 44 of the engaging member 36. Preferably, one of the mounting part 20 and the engaging portion 44 of the engaging member 36 has a guiding section 68, e.g., an inclined surface, so that the mounting part 20 can push the engaging portion 44 of the engaging member 36 in a second direction D2 via the guiding section 68. The elastic portion 66 stores an elastic force in response to displacement of the engaging portion 44 (see FIG. 4).

Figure 11:
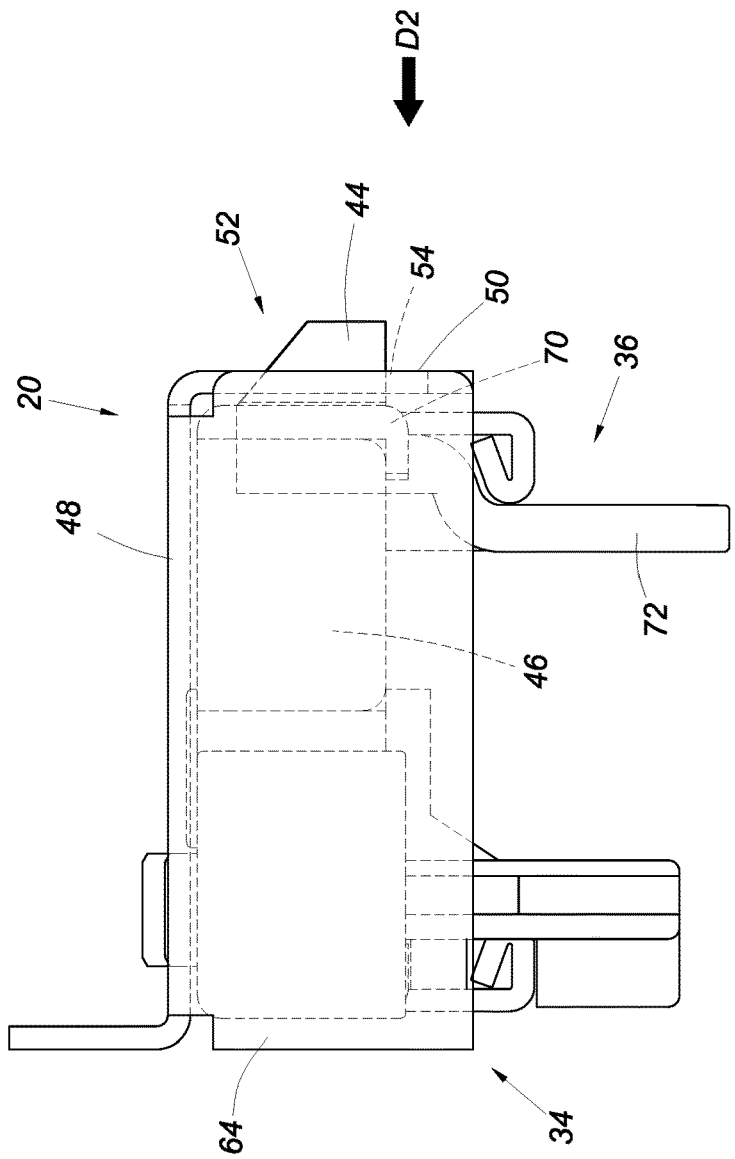
FIG. 11 schematically shows the mounting part and the rail in FIG. 10 after the mounting operation is completed.

Referring to FIG. 10 and FIG. 11, when the first mounting feature 52 of the mounting part 20 corresponds in position to the engaging portion 44 due to continued application of the force in the first direction D1, the elastic portion 66 of the engaging member 36 releases the stored elastic force (see FIG. 5) and thereby drives the engaging portion 44 into the second opening 54 of the first mounting feature 52 of the mounting part 20. While the mounting part 20 is mounted on the second rail 34, the base portion 48 of the mounting part 20 is adjacent to an upper portion of the second rail 34, and the first lateral portion 50 of the mounting part 20 is adjacent to a lateral side 70 of the second rail 34. It is worth mentioning that the user can subsequently operate and displace the engaging portion 44 of the engaging member 36 so that the engaging portion 44 is driven out of engagement with the first mounting feature 52 of the mounting part 20 to enable detachment of the mounting part 20 from the second rail 34. Preferably, the engaging member 36 has an operating portion 72 connected to the engaging portion 44. By pressing the operating portion 72, the user can displace the engaging portion 44 in the second direction D2 and hence away from the first mounting feature 52 of the mounting part 20.

While the present invention has been disclosed by way of the foregoing preferred embodiment, it is understood that the embodiment is not intended to be restrictive of the scope of the invention. The scope of patent protection sought by the applicant is defined by the appended claims.

What is claimed is:

1. A slide rail assembly, comprising:
   a first rail;
   a second rail displaceably coupled to the first rail, the second rail having a front portion and a longitudinally-opposed rear portion;
   a mounting part for mounting an object to the second rail, the mounting part being formed with an abutting portion; and
   an engaging member coupled to the second rail, the engaging member having a displaceable engaging portion and an elastic portion for applying an elastic force to the engaging portion;

wherein the mounting part includes a base portion and a first lateral portion substantially perpendicularly connected to the base portion to collectively define a receiving space, wherein one of the base portion and the first lateral portion has a first mounting feature engaged with the engaging portion of the engaging member when the mounting part receives the second rail in the receiving space thereof, a flexible portion being captured against the abutting portion responsive to the second rail being received in the receiving space, the engaging portion being biased to retentively engage the first mounting feature of the mounting part.

2. The slide rail assembly of claim 1, further comprising a second lateral portion substantially perpendicularly connected to the base portion, wherein the second lateral portion and the first lateral portion are located on two lateral sides of the base portion respectively and extend in different directions.

3. The slide rail assembly of claim 1, wherein the first mounting feature includes an opening and at least a pair of stop walls adjacent to the opening, and the engaging portion of the engaging member extends through the opening to engage with the stop walls.

4. The slide rail assembly of claim 1, wherein the second rail of the slide rail assembly includes a fastening portion, the mounting part includes a second mounting feature, the second mounting feature including a first wall and a second wall and being mounted to the fastening portion with the first wall and the second wall adjacent to two lateral sides of the fastening portion respectively when the mounting part receives the second rail in the receiving space.

5. The slide rail assembly of claim 1, wherein when the first mounting feature of the mounting part is engaged with the engaging member, the base portion of the mounting part is adjacent to a longitudinally-extending face of the second rail, and the first lateral portion of the mounting part is adjacent to a lateral side of the second rail.

6. The slide rail assembly of claim 1, wherein the flexible portion is mounted to the front portion of the second rail to extend in a longitudinal direction therefrom.

7. A slide rail assembly, comprising:
a displaceable rail having a front portion and a longitudinally-opposed rear portion;
a mounting part for mounting an object to the rail, the mounting part defining a receiving space and being formed with an abutting portion; and
an engaging member coupled to the rail, the engaging member having an elastic portion and a displaceable engaging portion;
wherein the mounting part includes a first mounting feature, and when the mounting part is being mounted to the rail to receive the rail in the receiving space, the mounting part pushes and thereby displaces the engaging portion of the engaging member, and the elastic portion stores an elastic force in response to the displacement of the engaging portion, and when the first mounting feature of the mounting part corresponds in position to the engaging portion, the elastic portion of the engaging member releases the elastic force to thereby bring the engaging portion into engagement with the first mounting feature of the mounting part, and when the engaging portion is engaged with the first mounting feature, a flexible portion being captured against the abutting portion responsive to the rail being received in the receiving space, the engaging portion being biased to retentively engage the first mounting feature of the mounting part.

8. The slide rail assembly of claim 7, wherein the mounting part includes a base portion, a first lateral portion, and a second lateral portion, wherein the first lateral portion and the second lateral portion are located on two lateral sides of the base portion respectively and extend in different directions, the first mounting feature being formed at the first lateral portion, and the second lateral portion is configured to abut against the object.

9. The slide rail assembly of claim 7, wherein the rail includes a fastening portion, and the mounting part includes a second mounting feature, the second mounting feature including a first wall and a second wall and being mounted to the fastening portion with the first wall and the second wall adjacent to two lateral sides of the fastening portion respectively when the mounting part receives the rail in the receiving space.

10. The slide rail assembly of claim 7, wherein one of the mounting part and the engaging portion of the engaging member has a guiding section, and the mounting part pushes the engaging portion of the engaging member via the guiding section.

* * * * *